United States Patent [19]

Cyze et al.

[11] Patent Number: 5,740,520
[45] Date of Patent: Apr. 14, 1998

[54] CHANNEL CORRECTION TRANSCEIVER

[75] Inventors: Baruch Cyze, Qiryat Motzkin; Haim Greenberger, Qiryat Tivon; Gabriel E. Glassman, Qiryat Yam, all of Israel

[73] Assignee: State of Israel, Haifa, Israel

[21] Appl. No.: 630,425

[22] Filed: Apr. 3, 1996

[51] Int. Cl.$^6$ .................................................... H04B 1/40
[52] U.S. Cl. .......................... 455/69; 455/63; 455/127; 455/115
[58] Field of Search ........................ 455/69, 115, 116, 455/126, 127, 63; 330/149; 375/285, 296, 297

[56] References Cited

U.S. PATENT DOCUMENTS

| | | |
|---|---|---|
| 4,291,277 | 9/1981 | Davis et al. . |
| 4,453,133 | 6/1984 | Travis . |
| 4,698,587 | 10/1987 | Merli et al. . |
| 5,023,937 | 6/1991 | Opas ..................................... 455/126 |
| 5,291,148 | 3/1994 | Reisner et al. . |
| 5,524,285 | 6/1996 | Wray et al. ........................ 455/116 X |

OTHER PUBLICATIONS

Stapleton and Cavers, "A New Technique for Adaptation of Linearizing Predistorters", 41st IEEE Vehicular Technology conference in May 1991.

Ghaderi et. al., "Adaptive Predistortion Linearizer using Polynomial Functions", IEEE Proceedings—Communications, vol. 141, No. 2, Apr. 1994.

Stapleton et al., "Stimulation and Analysis of an Adaptive Predistorter Utilizing a Complex Spectral Convolution", IEEE Transactions on Vehicular Technology, vol. 41, No. 4, Nov. 1992.

Ghaderi and Kumar, "Power Amplifier Adaptive Linearization using Predistortion with Polynomial Functions" 22nd European Microwave Conference in 1992.

*Primary Examiner*—Chi H. Pham
*Attorney, Agent, or Firm*—Wilson Sonsini Goodrich & Rosati

[57] ABSTRACT

A transceiver is provided which includes a transmitter for transmitting base band signals at a first operating frequency. The transmitter also includes a lookup table for storing correction coefficients for correcting the base band signals, a pre-distorter for correcting the base band signals and a receiver for receiving the base band signals transmitted by a remote transmitter in a first mode and by the transmitter in a second mode. The receiver includes apparatus for processing the received base band signals, a switching device for switching to the processing apparatus during the first mode and to the incoming signals to the lookup table updater during the second mode. The receiver also includes a lookup table updater, operative during the second mode, for receiving the signals transmitted by the transmitter and for updating the lookup table.

11 Claims, 5 Drawing Sheets

CHANNEL CORRECTION TRANSCEIVER

FIELD OF THE INVENTION

The present invention relates to a method and system for correcting transmission errors in general and more particularly to a method compensating for non-linearities caused by the transmitting channel.

BACKGROUND OF THE INVENTION

The use of mobile cellular radio for communication has increased markedly in recent years. The problem of non-linearity in power amplifiers is especially significant in cellular radio systems, where the relatively inefficient use of the spectrum by existing FM modulation techniques limits the available channels. Various linear modulation techniques have been proposed for the removal of non-linearity in power amplifiers, in order to achieve both spectrum and power efficiency. Known techniques for linearizing power amplifiers include such techniques as feed-forward, feedback, predistortion and using a LINC (linear amplification using non-linear components) transmitters.

In the case of microwave power amplifiers, predistorters are commonly used to compensate for non-linearity by distorting the signal before amplification. Different pre-distortion methods have been suggested. For example, U.S. Pat. No. 5,291,148 to Arnold describes a predistortion linearizer which compensates for the distortion produced by the power amplifier by introducing an amplitude or phase distortion to the signal source which is inverse to the distortion produced by the power amplifier.

U.S. Pat. No. 4,698,597 to Gabriele describes a three-way predistorter which subtracts the distortion products from the output signal prior to amplification of the signal. By generating a signal of the same amplitude but opposite phase to that generated by the power amplifier, an undistorted and amplified signal is obtained.

U.S. Pat. No. 4,453,133 to Travis describes a predistorter which uses an auxiliary voltage amplifier which receives a portion of the input signal to reduce the distortion.

U.S. Pat. No. 4,291,277 to Boyd describes a system which adapts itself to non-linearities present in an amplifier and predistorts the input signals. The degree of predistortion can be varied or updated as the non-linear characteristics of the amplifier change with time.

GB Pat. No 924,426 to Valentine describes the addition of a feed-back circuit to the transmitter circuit for further adjustment of a signal which has been initially modified by a predistortion linearizer.

Also, in a paper presented in the journal "IEEE Transactions on Vehicular Technology", by Stapelton in Nov. 1992, an adaptive predistortion linearizer uses a feedback loop to periodically update the predistorter parameters in order to adapt to changes in power amplifier characteristics.

In an article written by Ghaderi et. al., and published in Apr. 1994 by the "IEEE Proceedings —Communications" journal entitled "Adaptive Predistortion Linearizer using Polynomial Functions", the authors discuss the problem of convergence into a local minimum encountered by predis-tortion linearizers. The solution proposed uses a postdis-torter with similar polynomial coefficients to the predis-torter.

In a paper, entitled "Power Amplifier Adaptive Linearization using Predistortion with Polynomial Functions" presented by Ghaderi and Kumar, during the 22nd European Microwave Conference in 1992, it was shown that an adaptive predistorter using polynomial amplitude and phase predistortion functions can be used to linearize the power amplifier. A recursive least square algorithm is employed using demodulated signals to estimate the required predistortion.

The above systems compensate for amplifier distortion by operating on the transmitted signal in real time, that is, by compensating for non-linearity during actual transmission.

In a paper, entitled "A New Technique for Adaptation of Linearizing Predistorters", presented at the 41st IEEE Vehicular Technology conference in May 1991, Stapelton and Cavers refer to a technique for the adaptation of a pre-distorter which adjusts to the drifting characteristics in the power amplifier. This technique does not provide real-time adaptation during transmission but instead is based on the ability to sample out-of-band power and to use this scalar quantity to adjust the pre-distorter coefficients.

Figure 1:
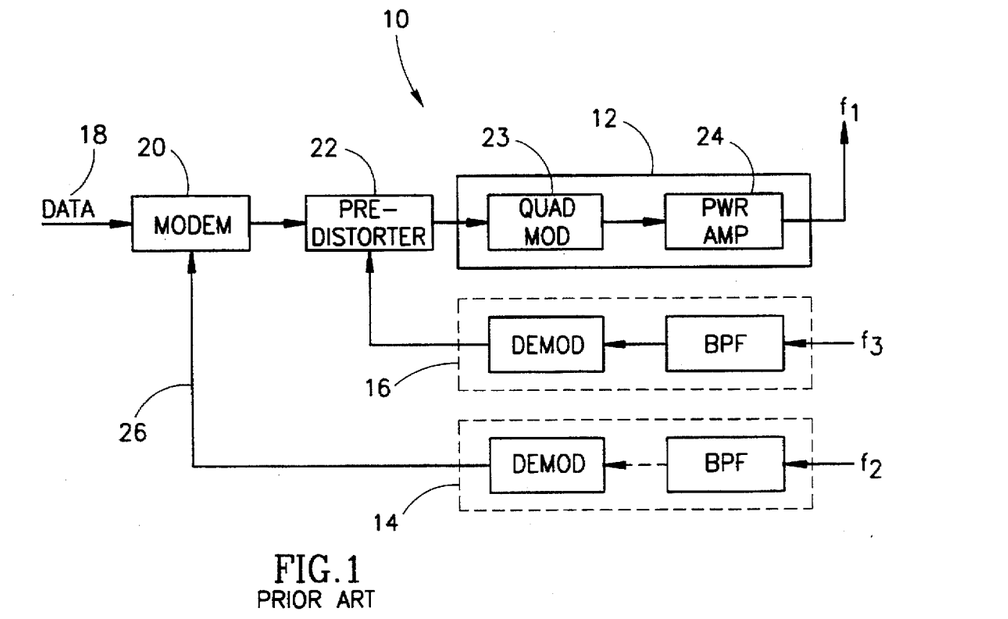
Fig. 1 is a block diagram illustration of a prior art transceiver, used for correction of non-linearization in power amplifiers.

Reference is now made to FIG. 1, where there is shown a block diagram of a prior art transceiver, generally designated 10, for the correction of amplified radio signals. Prior art transceiver 10 comprises a transmitter 12 and first and second receivers 14 and 16, respectively. Transmitter 12 and first receiver 14 are the two typical components of a transceiver, operating on different frequencies f1 and f2 respectively, for full duplex communication. Second receiver 16 is used as a diversity channel signal at a frequency f3. Frequency f3 may be set to be the same as transmitter frequency f1 during the calibration process.

During normal communication, data 18 passes through modem 20 and is then corrected by pre-distorter 22, prior to being transmitted. Transmitter 12 comprises a quadrature modulator 23 and a power amplifier 24. Modulator 23 modulates the "I" (In Phase) and "Q" (Quadratic) components of base band signals. Received signals 26 are sent directly to modem 20.

Pre-distorter 22, which can be any pre-distorter known in the art, corrects non-linearities of the entire transmitter chain as well as in power amplifier 24. For example, the pre-distorter technique referred to by Stapelton and Cavers refers to a technique which sample out-of-band power and uses this scalar quantity to adjust the pre-distorter coefficients. They use a special purpose receiver to monitor the transmitter, In the above technique, first receiver 14 is set to constantly receive signals of frequency f2. Second receiver 16 is used to make periodic checks of the out-of-band power by sending the received signals to pre-distorter 22. Adjustments are then made to the pre-distortion coefficients. During normal operation, both receivers are set to f2. The verification of the transmitter is made on an intermittent manner so as not to interfere with the system operation.

Figure 2:
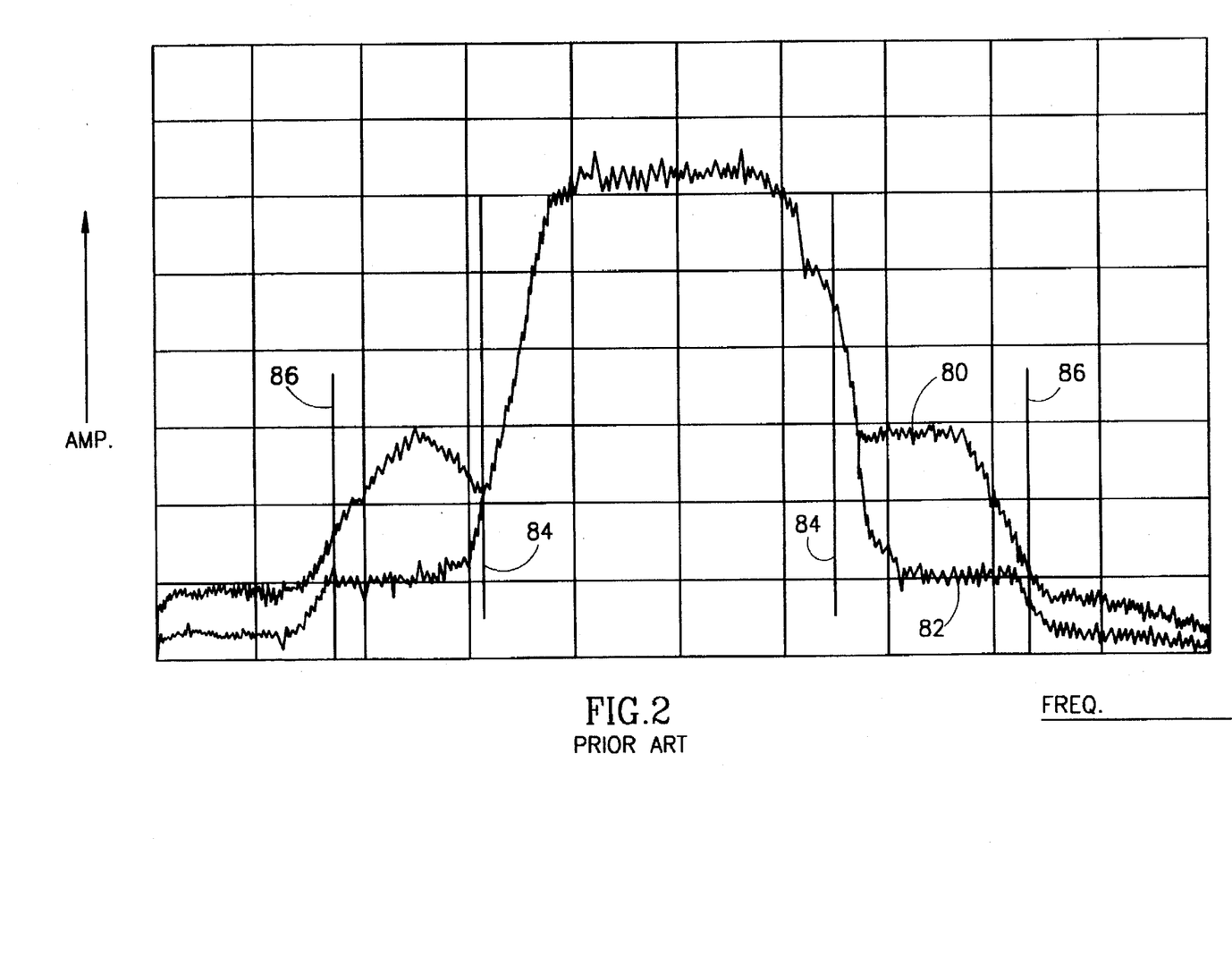
FIG. 2 a prior art, graphical representation illustration comparing power spectrum against frequency prior to and after the pre-distortion correction process.

FIG. 2 graphically illustrates the linearization achieved by the predistortion correction process. The signal illustrated is a QPSK (Quadrature Phase Shift Key) modulated carrier. Graph 80 and graph 82 compare the power spectrum in Db (y-axis) against frequency Khz (x-axis) for a non-corrected and a corrected linearized transmission, respectively. For example, for a modulated CW signal at 900 Mhz and average power of 36 dBm, the mid power spectrum lobe, indicated by vertical lines 84, shows that graphs 80 and 82 have similar amplitudes. At either extremity, between lines 84 and 86, corrected graph 82 typically illustrates a reduction in amplitude 84 of approximately 15–18 Db, compared with non-linearized transmission graph 80.

SUMMARY OF THE INVENTION

According to the invention there is provided a transceiver including a transmitter for transmitting base band signals at a first operating frequency. The transmitter includes a lookup table for storing correction coefficients for correcting the base band signals, a pre-distorter for correcting the base band signals and a receiver for receiving the base band signals transmitted by a remote transmitter in a first mode and by the transmitter in a second mode. The receiver includes apparatus for processing the received base band signals, a switching device for switching to the processing apparatus during the first mode and to the incoming signals to the lookup table updater during the second mode. The receiver also includes a lookup table updater, operative during the second mode, for receiving the signals transmitted by the transmitter and for updating the lookup table.

Additionally, in accordance with a preferred embodiment of the present invention, the base band signals transmitted by the remote transmitter in the first mode have a second operating frequency and the base band signals transmitted by the transmitter in the second mode have a first operating frequency.

Additionally, in accordance with a preferred embodiment of the present invention, the transmitter further includes a variable attenuator for controlling the power output of the base band signals and a power output level measurer for measuring the power output and for providing the base band signals to the pre-distorter only when the power output level exceeds pre-determined levels. Additionally, in accordance with a preferred embodiment of the present invention, the receiver further includes a band pass filter centered to the base band signals transmitted by the remote transmitter. Furthermore, the processing apparatus includes a modem.

Additionally, in accordance with a preferred embodiment of the present invention, the pre-distorter includes a shaping filter for filtering the in-phase and quadratic components of the base band signals. The pre-distorter further includes an error extractor unit for processing the filtered in-phase and quadratic components of the base band signals and for ascertaining the correction coefficients for adjusting the in-phase and quadratic components.

Additionally, in accordance with a further embodiment of the present invention, there is provided a transceiver including a transmitter for transmitting base band signals, the transmitter including a lookup table for storing correction coefficients for correcting the base band signals, a pre-distorter for correcting the base band signals, a variable attenuator for controlling the power output of the base band signals, a power output level measurer for measuring the power output and for providing the base band signals to the pre-distorter only when the power output level exceeds pre-determined levels and a receiver for receiving transmitted base band signals.

BRIEF DESCRIPTION OF THE DRAWINGS

These and further construction features of the invention will be better appreciated in the light of the ensuing description of a preferred embodiment thereof, given by way of example only with reference to the accompanying drawings wherein.

DETAILED DESCRIPTION OF A PREFERRED EMBODIMENT

Figure 3:
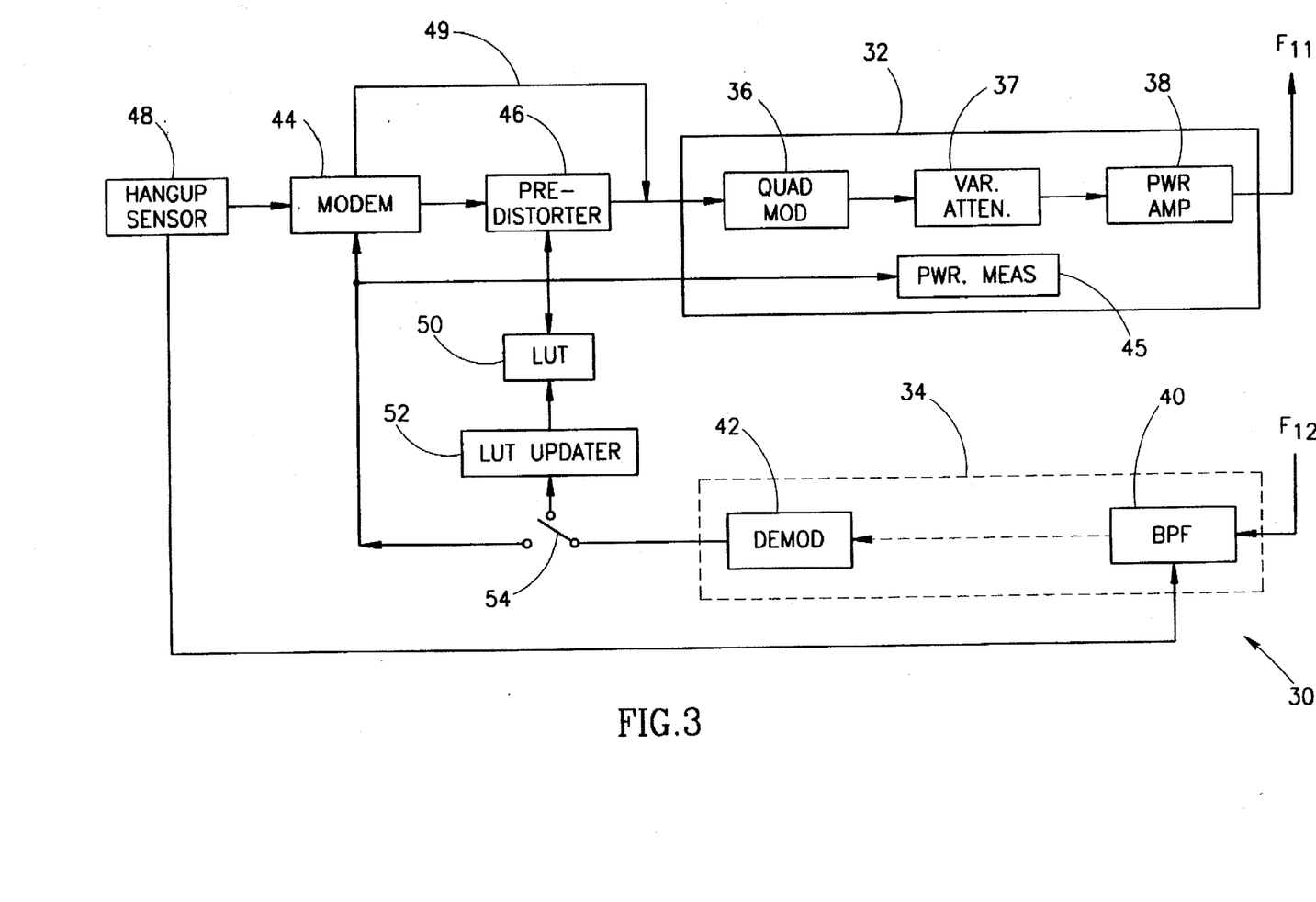
FIG. 3 is a block diagram illustration of a transceiver used for correction of non-linearization in power amplifiers, in accordance with a preferred embodiment of the present invention.

Reference is now made to FIG. 3 which illustrates a transceiver, generally designated 30, used for correction of non-linearization in accordance with a preferred embodiment of the present invention.

Transceiver 30 typically comprises a transmitter, generally designated 32 and a receiver, generally designated 34. Transmitter 32 and receiver 34 operate on different frequency channels F11 and F12 respectively, for full duplex communication.

Transmitter 32 comprises a quadrature modulator 36, a variable attenuator 37 and a power amplifier 38. Modulator 36 modulates the "I" (In Phase) and "Q" (Quadratic) components of the base band signals on to the transmitted frequency F11. Variable attenuator 37 controls the power output of the transmitted signal. Receiver 34 comprises a band pass filter (BPF) 40 and a demodulator 42. Transceiver 30 further comprises a modem 44, a power output measurer 45, a pre-distorter 46, a look-up table (LUT) 50 and a LUT updater 52. Whenever calibration is carried out, the main controller (not shown), which is generally situated at a base station, switches receiver 34 to accept a signal having a frequency of F11 and activates a logical switch 54 to switch the incoming signal toward updater 52 and lookup table 50 rather than to modem Transceiver 30 has two modes of operation, normal communication mode and calibration mode. In normal communication mode, that is during a conversation, in which full duplex transmission occurs, transceiver 30 transmits on frequency F11 and receives on frequency F12. During a conversation, lookup table 50 is used to correct for non-linearities in the data signal. Generally, when a conversation is not taking place, LUT updater 52 updates lookup table 50, adjusting for any irregularities and errors in look-up table 50.

It is a feature of the present invention that the pre-distorter method is not based on a real time closed loop. Pre-distorter 46 only operates when the power output exceeds pre-determined limits. During normal communication, the transmitted power is generally much lower than the maximal power, for the most of the time. If the output power is at least 15 Db lower than the maximum power, pre-distortion is not required. At lower power levels, the out of band emission complies with FCC (Federal Communications Commission) regulations without the need for linearization.

Thus, during normal communication mode, the output power level of the data signal is measured and if the power levels are sufficiently low and thus, pre-distortion is not needed, the data signal is sent directly from modem 44 (shown by arrow 49) to transmitter 32, without being pre-distorted by pre-distorter 46.

Whenever the power levels are sufficiently high, that is, for example, within 15 Db of the maximum power, the data signals are sent to pre-distorter 46. Pre-distorter 46 linearizes the data signal to be transmitted, by distorting the "I" and "Q" components of the signals by reference to linearizing coefficients stored in look-up table 50. In this normal mode, data passes through modem 44 and is then pre-distorted by pre-distorter 46 prior to being transmitted by transmitter 32, using frequency F11. An incoming signal, having a frequency F12, is sent, via BPF 40 and demodulator 42, directly to modem 44. BPF 40 is centered at frequency F12 and acts to filter out most of the energy of the transmitted signal of frequency F11. Bandpass filter 42 acts to protect receiver 34 from damage or saturation.

In accordance with the present invention, calibration is optimally carried out during non-duplex communication periods. Thus, whenever a transmission has been completed, transceiver 30 is on standby and is available for calibration of look-up table 50. The controller sends a signal having a frequency of F11 which activates switch 54 to pass incoming signals via updater 52 and lookup table 50 to pre-distorter 46. Signals having a frequency of F11 of sufficiently high enough power are reduced by BPF 40 and passed through to LUT updater 52. Switch 54 is optimally a logical switch activated by software. LUT updater 52 compares the received signal with the desired one and updates lookup table 50 accordingly. The above described procedure, for calibrating look-up table 50, may also be used during idle or no voice periods of normal communication.

Figure 4:
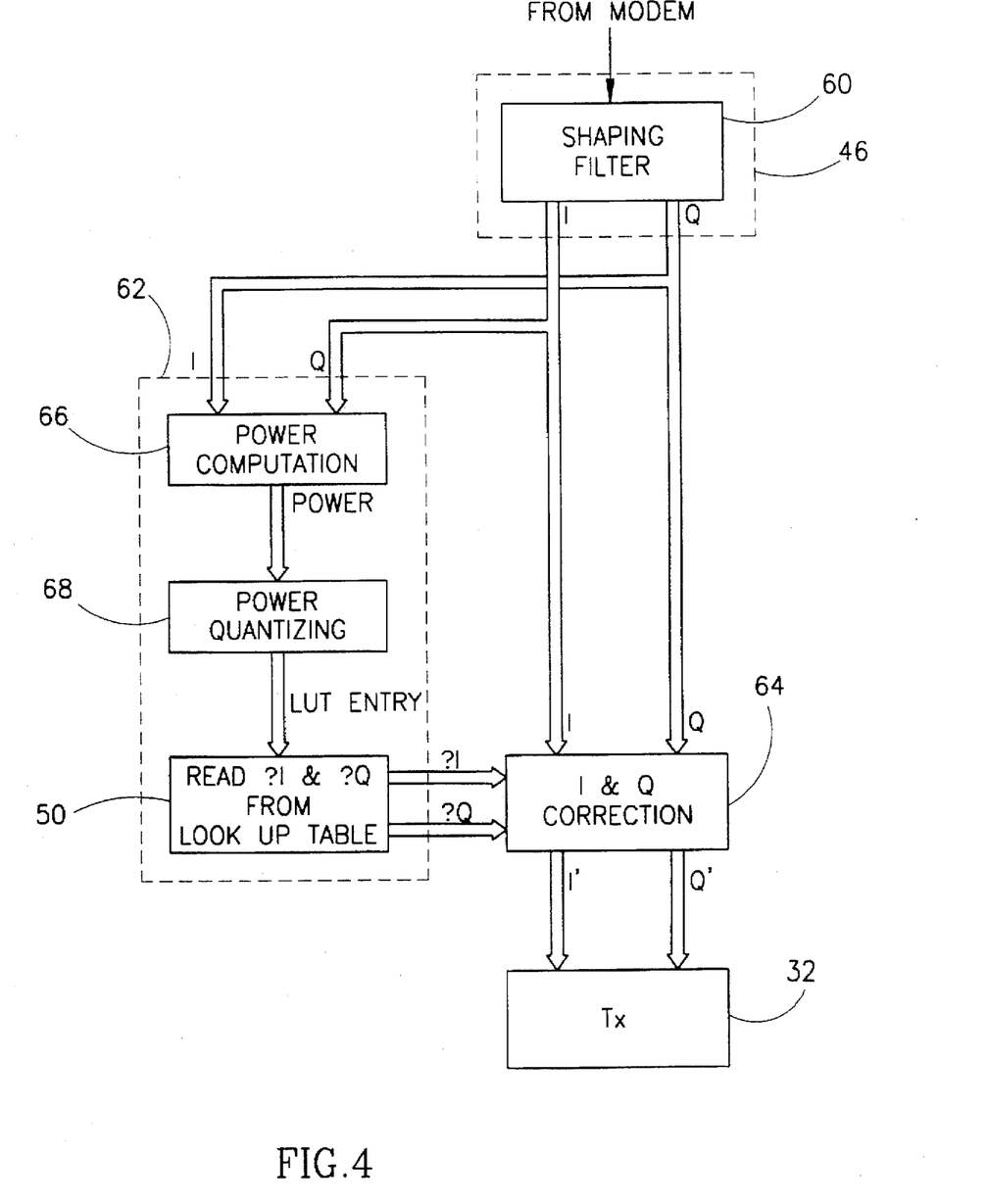
FIG. 4 is a flow chart illustration of the real time non-linearizer corrector of the preferred embodiment of the present invention.
Figure 5:
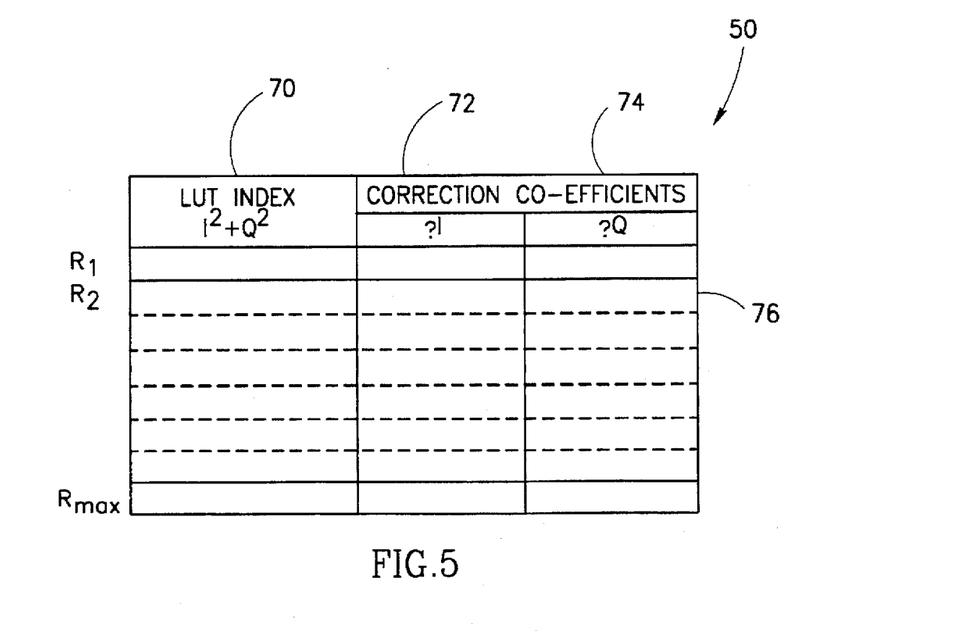
FIG. 5 is a diagram illustration of the structure of a look-up table used in the preferred embodiment of the present invention.

Reference is now made to FIGS. 4 and 5. FIG. 4 illustrates the operation of pre-distorter 46 in the form of a flow chart. FIG. 5 illustrates the structure of look-up table 50.

Referring to FIG. 4, signals from modem 44 are corrected for nonlinearization by pre-distorter 46 prior to being transmitted by transmitter 32. Pre- distorter 46 comprises a shaping filter 60, an error extractor 62 and a correction unit 64. Shaping filter 60, of a type known in the art, filters the "I" and "Q" components of the signal.

Error extractor 62 processes the filtered "I"and "Q" components in order to ascertain the correction coefficients needed to adjust the "I"and "Q" components. Correction unit 64 calculates the revised "I" and "Q" values from the correction coefficients stored in look-up table 50. The corrected "1" and "Q" values are then transmitted, via quadrature modulator 36 and power amplifier 38 (FIG. 3).

Error extractor 62 comprises three elements; a power computation unit 66, a power quantizing unit 68 and look-up table 50.

Look-up table 50, contains correction coefficients ($\delta I$ and $\delta Q$) for different values of "I" (in-phase) and "Q" (quadratic) components of the base-band signal. Look-up table 50 (FIG. 5) comprises three columns, 70, 72 and 74, entitled "LUT index ($I^2+Q^2$)", "$\delta I$" and "$\delta Q$", respectively. $\delta I$ and $\delta Q$ are the correction coefficients which are used to adjust the values of "I" and "Q".

Look-up table 50 further comprises a plurality of rows 76, indicated r1, r2 ... rmax, where the entries for r1 relate to the minimum values of "I" and "Q" and $r_{max}$ relates to the maximum values of "I" and "Q". For the purposes of example only, look-up table 50 contains 64 entries. Optionally, the maximum number of entries can be increased to 128.

In operation, the signal to be transmitted is passed through predistorter 46, where the signal is filtered by shaping filter 60. The filtered "I" and "Q" components are then processed by error extraction process 62. First, power computation unit 66 calculates the value of $p^2 = (I^2 + Q^2)$. Power quantizing unit 68 quantizes the received value of P to one of the values in column 70 look-up table. The corresponding values of "$\delta I$" and "$\delta Q$" are then read from look-up table (LUT) 50.

The revised values of I' and Q' are calculated by correction unit 64, as follows:

$$I'=I*\delta I + Q*\delta Q; \text{ and} \quad (1)$$

$$Q'=Q*\delta Q + Q*\delta I.I. \quad (2)$$

where: I and Q are the uncorrected values and $\delta I$ and $\delta Q$ are the correction coefficients.

The corrected signal, comprising the revised values of I' and Q', is then transmitted by transmitter 32.

Figure 6:
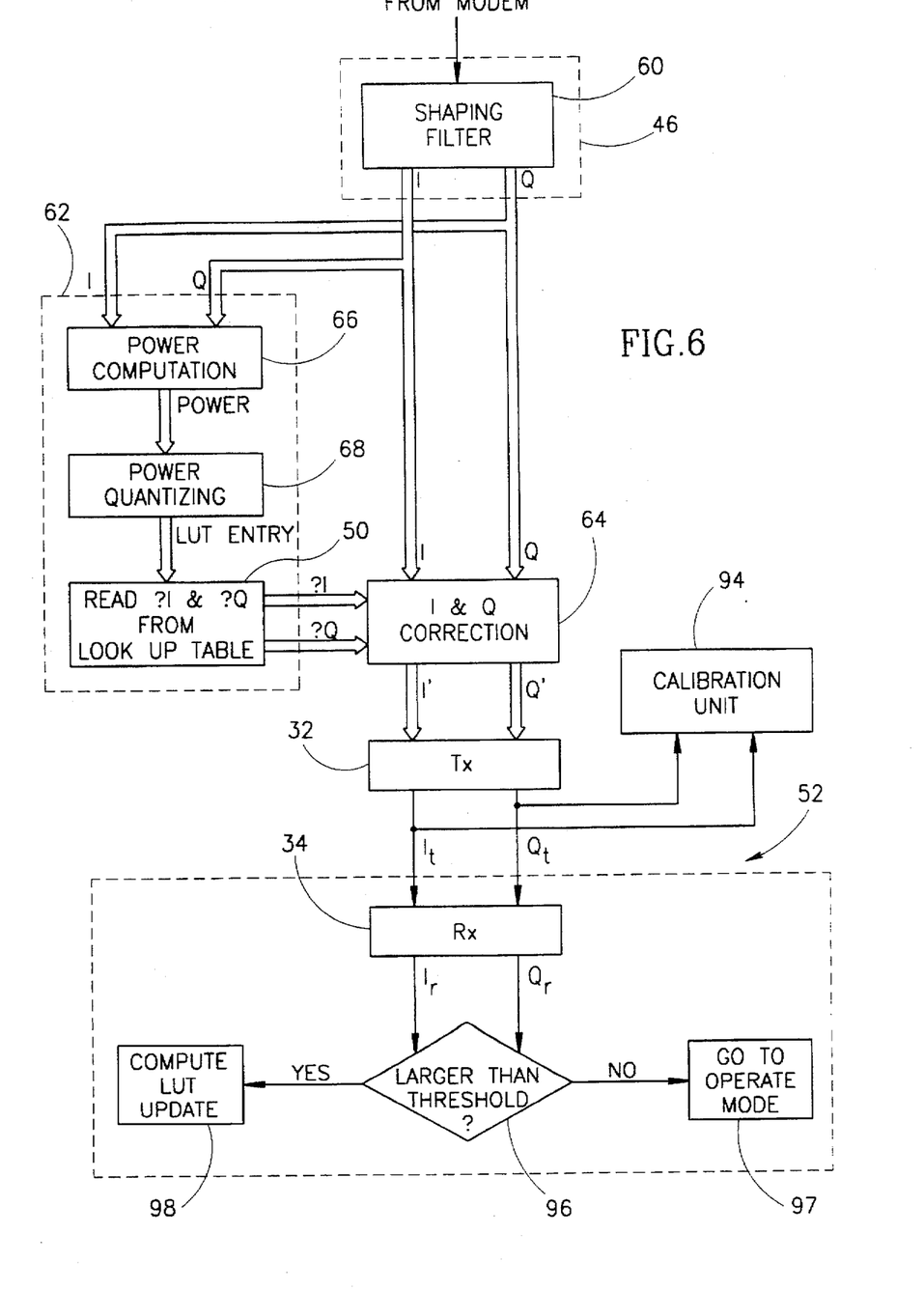
FIG. 6 is a flow chart illustration of the process of updating the look-up table of the calibrator of the preferred embodiment of the present invention.

Reference is now made to FIG. 6 which is a flow chart illustrating the calibration operation of the preferred embodiment of the present invention. A series of test signals, each having a different value of I and Q, are pre-distorted by pre-distorter 46 and then transmitted and received as described hereinabove. The different values of I and Q are generated by a calibration vector unit 94.

Calibration vector unit 94 may be any unit which increments the values of "I" and "Q", such as a linear staircase amplitude modulated sin/cos (LSAM) vector which increments the voltage or a non-linear staircase amplitude modulated sin/cos (NLSAM) vector which increments the power values.

LUT updater 52 compares the output values ($I_r$ and $Q_r$) of the received signal (step 96) with the transmitted $I_t$ and $Q_t$ values for each test signal. For a correctly calibrated LUT 50, $I_r$ and $Q_r$ values should be equal to the transmitted $I_t$ and $Q_t$ values. In this case, calibration is not needed and transceiver 30 defaults to communication mode (step 97). the If the $I_r$ and $Q_r$ values are outside pre-determined threshold values, LUT 50 is updated (step 98).

To generate LUT 50 for the first time, the calibration vector unit 94 assigns values to the "I" and "Q" components throughout the dynamic range of the transmitting channel. Complex transfer functions are computed from the difference between the plurality of $I_t$ and $Q_t$ values transmitted by transmitter 32 and the $I_r$ and $Q_r$ values output by receiver 34 and the correction coefficients and $\delta Q$), which are to be used to correct for non-linearization, are calculated and stored in LUT 50.

In operation, to generate look-up table 50, transmitter 32 is set to transmit at its maximum power. The initial values of "I" and "Q" are set to values which require the use of the pre-distorter, for example, Imax/4 and Qmax/4, respectively, where Imax and Qmax are pre-determined maximal values of "I" and "Q".

The following computations are made for each of the other test signals:

$$NLG = ABS \text{ (rec)}/ABS\text{(trans)}; \quad (3)$$

$$\phi = \arctan(Qr/Ir) - \arctan(Qt/It); \quad (4)$$

where:

NLG is the nominal linear gain;

$\phi$ is the difference in the rotation angle;

rec $= Ir^2 + Qr^2$; and trans $= It^2 + Qt^2$.

The difference in the transfer function ($\delta I$ and $\delta Q$), which is due to the non-linear nature of the transmission, is then calculated for different k values of $I_t$ and $Q_t$. The values of $I_t$ and $Q_t$ are determined by calibration vector unit 94 and are within the range of $\geq$ Imax/4 and $\leq$ Imax.

The following computations are made, for each k value of $I_t$ and $Q_t$ generated by the selected calibration vector unit 94:

$$mag(k) = ABS(rec(k)) / ABS(trans(k)); \quad (5)$$

where: mag(k) = nominal linear gain for (k)  (6)

θ(k) = arctan (Qrec(k)/Irec(k))×arctan (Q(k)/I(k));  (7)

δmag(k) = mag(k)/NLG;  (8)

δθ(k) = θ(k) −θ;  (9)

In an ideal linear system, δmag(k) =1 and δθ(k) =0.

Communication system 30 is then linearized to a gain equal to 90% of NLG. The gain and phase correction factors are calculated, using a back off factor (BOF) =0.9, as follows:

Gain correction (GC(k)) =BOF * NLG/δn mag(k);  (10)

Phase correction (PC(k)) =θ−δθ(k) =2*θ−θ(k).  (11)

The correction coefficients δI and δQ, to be stored in LUT 50, are then calculated for each value of k, as follows:

δI(k) =GC(k) * cos (PC(k)) and  (12)

δQ(k) =GC(k) * sin (PC(k)).  (13)

The preferred size for the look-up table is 64 entries. If the number k of entries is greater than 64, the size of table 50 is reduced to M=64 by only taking every Zth value, where Z= kmax/M.

Look-up table 50 now consists of 64 entries for different values of $I_t$ and $Q_t$. The values of δI and δQ should be within the pre-determined threshold values, close to the ideal linear values of 0 and 1, respectively.

After LUT 50 has been initially assigned values, LUT 50 is checked by transmitting a signal through error extraction process 62, as described hereinbefore. The corrected signal having values of I' and Q' is then transmitted through receiver 34 and checked by LUT updater 52. For a correctly calibrated LUT 50, "Irec" and "Qrec" values, should be equal to the transmitted $I_t$ and $Q_t$ values, respectively.

If "Irec" and "Qrec" values, are not sufficiently close to the transmitted $I_t$ and $Q_t$ values, respectively, LUT 50 requires to be updated. The updating process is similar to the initial generation process, described hereinbefore. That is, values of δmag(k)[equation 8]and δθ(k) [equation 9]are calculated from the differences between input and output values of a plurality of "I" and "Q" values generated.

If ABS(δmag(k) −1) ≧0.1 or δθ(k) ≧0.5, then the gain and phase correction factors, GC(k) and PC(k) respectively, are calculated using a back-off factor of 0.9, as hereinbefore described. Then revised values of the LUT elements δI'(k) and δθ'(k) generated are used to update look-up table 22, according to the following formulae:

δI(k) =δI'(k) * δQ'(k) * δQ '(k); and  (14)

δQ(k) =δQ'(k) +δI'(k) * δQ(k).  (15)

The updating calibration process can be terminated at any time. It is not necessary to update all δI(k) and δQ(k) entries at the same session. Updating can be carried out whenever it is convenient, such as when a conversation has been terminated.

As will be appreciated by persons knowledgeable in the art, the various embodiments hereinbefore referred are given by way of example only and do not in any way limit the present invention.

Those skilled in the art will be readily appreciate that various changes, modifications and variations may be applied to the preferred embodiments without departing from the scope of the invention as defined in and by the appended claims.

We claim:

1. A transceiver comprising:
   a. a transmitter for transmitting base band signals at a first operating frequency, said transmitter comprising:
      I. a lookup table for storing correction coefficients for correcting said base band signals;
      ii. a pre-distorter for correcting said base band signals; and
   b. a receiver for receiving base band signals transmitted by a remote transmitter in a first mode and by said transmitter in a second mode, said receiver comprising:
      I. means for processing said received base band signals;
      ii a lookup table updater, operative during said second mode for receiving said signals transmitted by said transmitter and for updating said lookup table; and
      iii. a switching device which receives the base band signals and switches between said means for processing during said first mode and said lookup table updater during said second
      iii. a lookup table updater, operative during said second mode for receiving said signals transmitted by said transmitter and for updating said lookup.

2. The transceiver according to claim 1 and wherein said base band signals transmitted by said remote transmitter in said first mode have a second operating frequency.

3. The transceiver according to claim 1 and wherein said base band signals transmitted by said transmitter in said second mode have a first operating frequency.

4. The transceiver according to claim 1 and wherein said transmitter further comprises:
   a. a variable attentuator for controlling the power output of said base band signals; and
   b. a power output level measurer for measuring said power output and for providing said base band signals to said pre-distorter only when said power output level exceeds pre-determined levels.

5. The transceiver according to claim 1 and wherein said receiver further comprises a band pass filter centered to said base band signals transmitted by said remote transmitter.

6. The transceiver according to claim 1 and wherein said means for processing comprises a modem.

7. The transceiver according to claim 1 and wherein said pre-distorter comprises a shaping filter for filtering the in-phase and quadratic components of said base band signals.

8. The transceiver according to claim 7 and wherein said pre-distorter further comprises an error extractor unit for processing said filtered in-phase and quadratic components of said base band signals and for ascertaining the correction coefficients for adjusting said in-phase and quadratic components.

9. A transceiver comprising:
   a. a transmitter for transmitting base band signals, said transmitter comprising:
      i. a lookup table for storing correction coefficients for correcting said base band signals;
      ii. a pre-distorter for correcting said base band signals;
      iii. a variable attentuator for controlling the power output of said base band signals;
      iv. a power output level measurer for measuring said power output and for providing said base band signals to said pre-distorter only when said power output level exceeds pre-determined levels; and
   b. a receiver for receiving transmitted base band signals.

10. The transceiver according to claim 9 and wherein said pre-distorter comprises a shaping filter for filtering the in-phase and quadratic components of said base band signals.

11. The transceiver according to claim 10 and wherein said pre-distorter further comprises an error extractor unit for processing said filtered inphase and quadratic components of said base band signals and for ascertaining the correction coefficients for adjusting said in-phase and quadratic components.

* * * * *